(12) United States Patent
Hoentschel et al.

(10) Patent No.: US 8,247,275 B2
(45) Date of Patent: Aug. 21, 2012

(54) STRAIN ENGINEERING IN THREE-DIMENSIONAL TRANSISTORS BASED ON GLOBALLY STRAINED SEMICONDUCTOR BASE LAYERS

(75) Inventors: Jan Hoentschel, Dresden (DE); Sven Beyer, Dresden (DE); Uwe Griebenow, Markkleeberg (DE)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 12/898,958

(22) Filed: Oct. 6, 2010

(65) Prior Publication Data
US 2011/0101456 A1    May 5, 2011

(30) Foreign Application Priority Data
Oct. 30, 2009   (DE) .......................... 10 2009 046 246

(51) Int. Cl.
*H01L 21/00* (2006.01)
(52) U.S. Cl. ................. 438/150; 438/157; 257/E21.442

(58) Field of Classification Search .................. 438/150, 438/157, 198, 938; 257/E21.442
See application file for complete search history.

(56) References Cited

U.S. PATENT DOCUMENTS

| 6,413,802 | B1 * | 7/2002 | Hu et al. ........................ 438/283 |
| 7,390,701 | B2 * | 6/2008 | Cheng et al. ................... 438/151 |
| 2009/0159972 | A1 | 6/2009 | Jakschik et al. .............. 257/350 |

OTHER PUBLICATIONS

Translation of Official Communication from German Patent Office for German Patent Application No. 10 2009 046 246.5 dated Feb. 9, 2011.

* cited by examiner

*Primary Examiner* — Chandra Chaudhari
(74) *Attorney, Agent, or Firm* — Williams, Morgan & Amerson, P.C.

(57) ABSTRACT

Non-planar transistors, such as FINFETs, may be formed on the basis of a globally strained semiconductor material, thereby preserving a high uniaxial strain component in the resulting semiconductor fins. In this manner, a significant performance enhancement may be achieved without adding process complexity when implementing FINFET transistors.

16 Claims, 7 Drawing Sheets

STRAIN ENGINEERING IN THREE-DIMENSIONAL TRANSISTORS BASED ON GLOBALLY STRAINED SEMICONDUCTOR BASE LAYERS

BACKGROUND OF THE INVENTION

1. Field of the Invention

Generally, the present disclosure relates to the fabrication of highly sophisticated integrated circuits including transistor elements having a non-planar channel architecture.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a planar transistor architecture, on the distance between the source and drain regions, which is also referred to as channel length.

Presently, the vast majority of integrated circuits are formed on the basis of silicon due to its substantially unlimited availability, the well-understood characteristics of silicon and related materials and processes and the experience gathered during the past 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material for gate insulation layers that separate the gate electrode, frequently comprised of polysilicon or other metal-containing materials, from the silicon channel region. In steadily improving device performance of field effect transistors, the length of the channel region has been continuously decreased to improve switching speed and drive current capability. Since the transistor performance is controlled by, among other things, the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length for a planar transistor configuration requires an increased capacitive coupling to avoid the so-called short channel behavior during transistor operation. The short channel behavior may lead to an increased leakage current and to a pronounced dependence of the threshold voltage on the channel length. Aggressively scaled planar transistor devices with a relatively low supply voltage and thus reduced threshold voltage may suffer from an exponential increase of the leakage current due to the required enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although usage of high speed transistor elements having an extremely short channel may typically be restricted to high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range of 1-2 nm that may no longer be compatible with requirements for many types of circuits.

For these reasons, a plurality of alternative approaches have been developed in an attempt to further enhance performance of planar transistors while avoiding the above-described problems. For instance, replacing silicon dioxide as material for gate insulation layers has been considered, particularly for extremely thin silicon dioxide gate layers. For example, dielectric material with significantly increased dielectric constant may be used, such as hafnium oxide and the like, which, however, may require additional complex processes, thereby contributing to a very complex overall process flow. According to other strategies, performance of planar transistors may be efficiently increased by modifying the lattice structure in silicon-based semiconductor materials. As is well known, tensile or compressive strain may significantly change the charge carrier mobility in silicon-based semiconductor materials, thereby allowing a significantly enhanced performance of planar transistors. For instance, for a standard crystallographic orientation of a silicon-based material, the generation of a tensile strain component along the current flow direction of the channel region of a planar transistor may significantly increase mobility of electrons and thus switching speed and drive current capability of the transistor may be increased. On the other hand, for the same standard crystallographic configuration, uniaxial compressive strain in the channel region may enhance mobility of holes, thereby providing the possibility of increasing performance of P-channel transistors. A corresponding strain component may be obtained by providing globally strained semiconductor materials in which corresponding active regions of transistors may be formed. In other well-established process techniques, the strain may be locally generated in the channel region of the transistors by implementing various strain-inducing mechanisms, such as incorporating a strain-inducing semiconductor material in the drain and source regions of N-channel transistors and/or P-channel transistors. For instance, providing a silicon/germanium alloy in the drain and source regions may result, due to the lattice mismatch between the silicon-based material and the silicon/germanium alloy, in a strained configuration, thereby inducing a substantially uniaxial compressive strain component, which may thus increase performance of P-channel transistors. Furthermore, other well-established strain-inducing mechanisms may be applied in the form of highly stressed materials positioned in close proximity to the transistors, thereby also inducing a desired strain component. For this purpose, the interlayer dielectric material provided in the contact level of the transistor elements may be used to induce a desired type of strain.

Figure 1A:
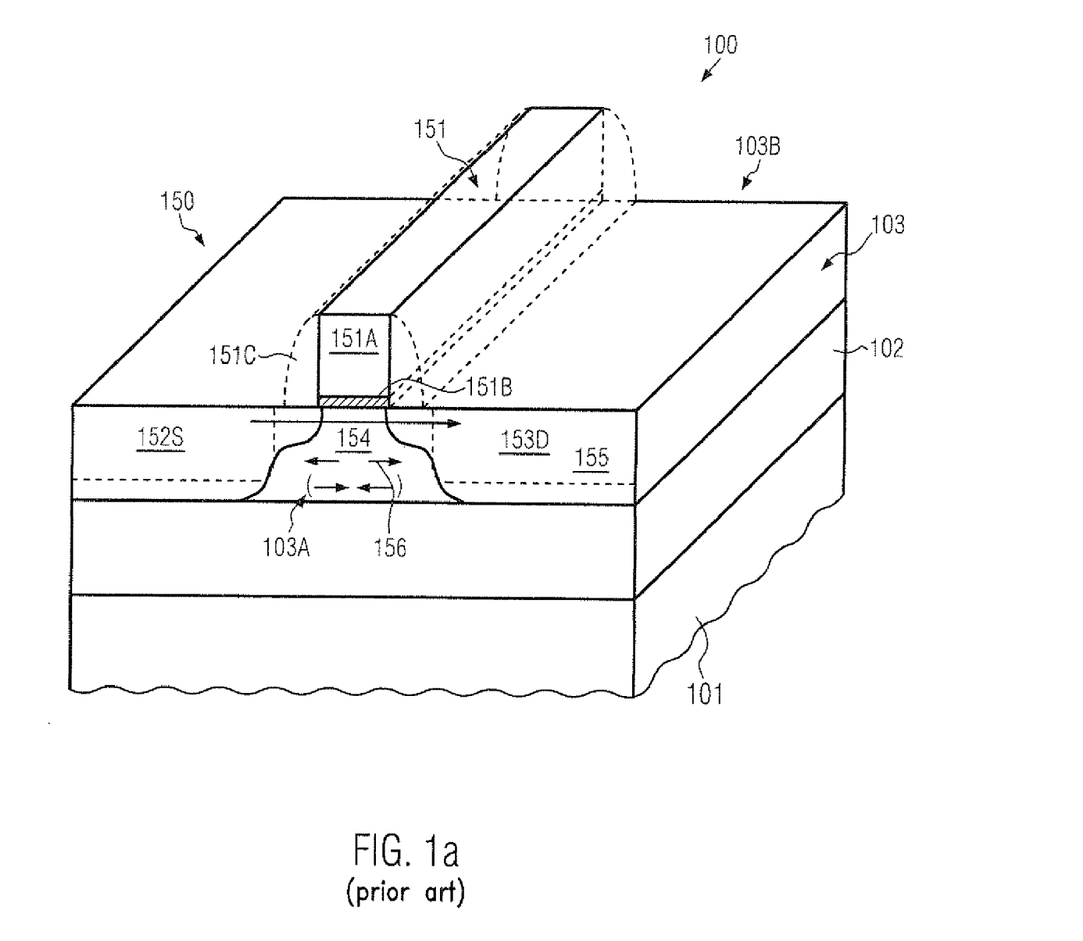
FIG. 1a schematically illustrates a perspective view of a planar sophisticated transistor element including a strain-inducing mechanism.

FIG. 1a schematically illustrates a perspective view of a sophisticated semiconductor device 100 comprising a planar transistor 150, which may be used in complex logic circuits, such as CPUs and the like, in order to obtain a high switching speed and the required drive current as may be necessary for sophisticated applications. As illustrated, the conventional device 100 may comprise a substrate 101, such as a silicon substrate and the like, possibly in combination with a buried insulating layer 102, thereby providing a silicon-on-insulator (SOI) architecture, which may generally provide certain advantages in terms of switching speed and the like. Moreover, a silicon-based semiconductor layer 103 is formed on the buried insulating layer 102 and may comprise a plurality of "active" regions 103A which are laterally delineated by isolation structures 103B, such as shallow trench isolations and the like. It should be appreciated that an active region is to be understood as a semiconductor region in which appropriate PN junctions are formed or are to be formed for at least one transistor element. In the example shown, the active region 103A comprises a source region 152S and a drain region 153D, which may represent highly doped semiconductor regions so as to provide a moderately high conductivity and to form a PN junction with a channel region 154 positioned between the source region 152S and the drain region 153D. In the case of a P-channel enrichment transistor, the drain and source regions 153D, 152S may be P-doped, while the channel region 154 may be slightly N-doped. Thus, for achieving a high drive current of the transistor 150 in the case of a P-channel transistor, the channel region 154 has to be enriched with holes as charge carriers so as to enable a P-conductive path from the source region 152S to the drain region 153D. For an N-channel transistor, inversely doped drain and source regions and a channel region has to be provided. Furthermore, the transistor 150 comprises a gate electrode structure 151, which may comprise an electrode material 151A that is formed on a gate dielectric material 151B, which thus separates the electrode material 151A from the channel region 154. Furthermore, frequently, a spacer structure 151C may be formed on sidewalls of the electrode material 151A wherein, for convenience, the spacers 151C are illustrated so as to be transparent in order to not unduly obscure the illustration of the transistor 150.

The interface between the channel region 154 and the gate dielectric material 151B may substantially determine the electronic characteristics of the transistor 150, wherein this interface is provided within a single plane so that the transistor 150 may be considered as a planar transistor device. As previously explained, one important parameter of the transistor 150 is represented by the length of the gate electrode structure 151, which may be understood as the horizontal extension of the electrode material 151A. For instance, in sophisticated applications, the gate length is approximately 50 nm and less, which may thus require a high capacitive coupling of the electrode material 151A to the channel region 154 via the gate dielectric material 151B. Consequently, the thickness and/or the material composition of the gate dielectric material 151B has to appropriately be selected in order to provide the desired capacitive coupling. Furthermore, the overall drive current of the transistor 150 is also determined by the transistor width, since the width determines the total area available for the charge carrier transport.

Due to the limitations with respect to leakage currents of gate dielectric material and due to the complexity of patterning gate electrode structures and active regions for achieving the required high drive current capability in combination with a high switching speed, additional mechanisms have been implemented in order to create a desired type of strain 156 in the channel region 154. For example, a strain-inducing semiconductor alloy 155 may be incorporated into the drain and source regions 152S, 153D which may have a strained state and which may thus induce the strain 156. Additionally or alternatively to the strain-inducing material 155, the spacer structure 151C may be provided as a highly stressed dielectric material and/or a further material may be formed on the drain and source regions 152S, 153D in a highly stressed state, thereby also inducing a certain degree of strain in the channel region 154. Although these mechanisms may provide a significant enhancement of transistor performance for a given geometric configuration of the transistor 150, upon further device scaling, i.e., upon further reducing the length of the gate electrode structure 151, the efficiency of these mechanisms may significantly decrease, thereby resulting in a less pronounced performance gain.

For these reasons, alternative transistor architectures have been proposed, such as "three-dimensional" architectures, in which a desired channel width and thus transistor width may be obtained at reduced overall lateral dimensions, while at the same time superior controllability of the current flow through the channel region may be achieved. To this end, so-called FINFETs have been proposed in which a thin sliver or fin of silicon may be formed in a thin layer of an SOI substrate, wherein, at least on both sidewalls of the fin and possibly on a top surface thereof, a gate dielectric material and a gate electrode material may be provided, thereby realizing a double gate or tri-gate transistor whose channel region may be fully depleted. Typically, in sophisticated applications, the width of the silicon fins may be on the order of magnitude of 10-20 nm and the height thereof may be on the order of magnitude of 30-40 nm.

Thus, FINFET transistor architectures may provide advantages with respect to increasing the effective coupling of the gate electrode to the various channel regions without requiring a corresponding reduction in thickness of the gate dielectric material. Moreover, by providing this non-planar transistor architecture, the effective channel width may also be increased so that, for given overall lateral dimensions of a transistor, an enhanced current drive may be obtained.

Figure 1B:
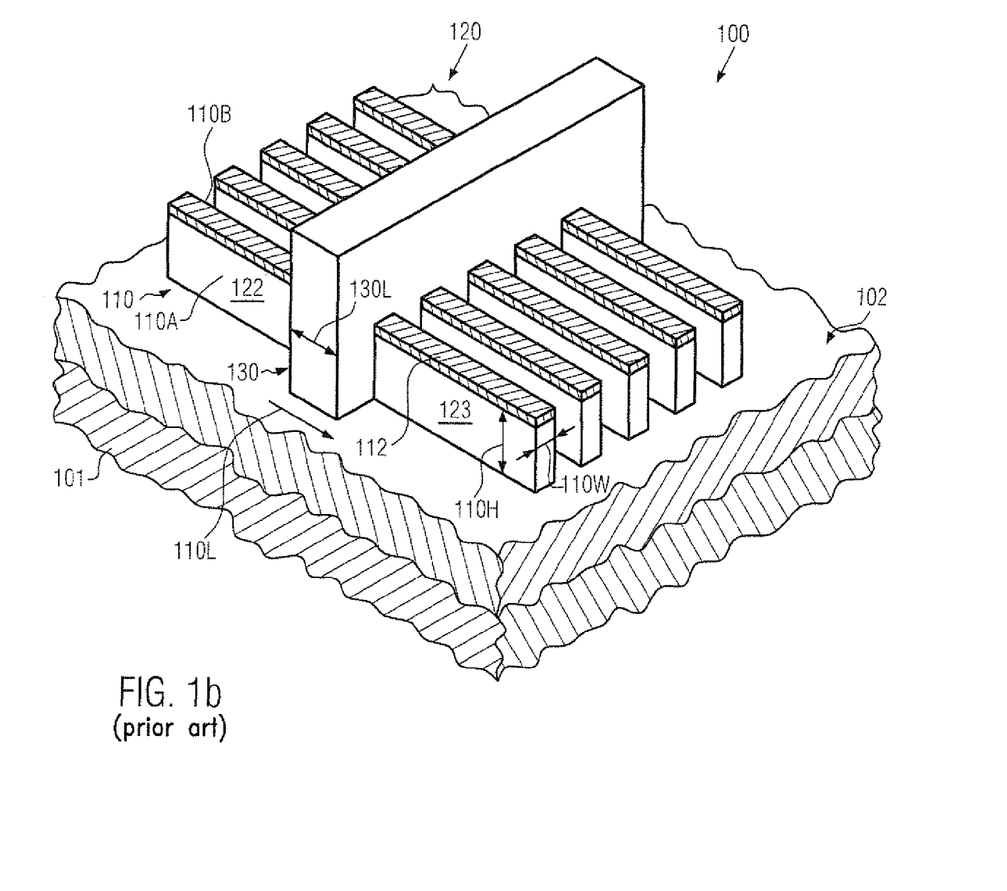
FIG. 1b schematically illustrates a perspective view of a three-dimensional transistor, such as a FINFET, comprising a plurality of semiconductor fins formed in accordance with conventional process strategies.

FIG. 1b schematically illustrates a perspective view of the semiconductor device 100 which comprises a FINFET transistor 120, which is to represent any three-dimensional or "vertical" transistor architecture. As illustrated, the device comprises the substrate 101 and the "buried" insulating layer 102 on which are formed a plurality of semiconductor fins 110, which may thus represent the "residues" of a portion of the semiconductor layer 103 (FIG. 1a). Moreover, a gate electrode structure 130 may be formed adjacent to a central portion of the semiconductor fins 110 so as to define corresponding channel regions therein. It should be appreciated that the gate electrode structure 130 may comprise a gate dielectric material formed on sidewalls 110A, 110B of the semiconductor fins 110, and also possibly on a top surface of the fins 110 when the top surface is to be used as a channel region. In the example shown, a dielectric cap layer 112 may be formed on top of the semiconductor fins 110 with an appropriate thickness so as to substantially suppress any electrical influence of the gate electrode structure 130 through the top surface of the semiconductor fins 110. In this case, only the sidewalls 110A, 110B may represent the actual control areas for controlling a current flow through the semiconductor fins 110. Consequently, each of the fins 110 may comprise a source region 122 and a drain region 123 which may represent respective end portions of the fins 110 and which may thus have an appropriate dopant concentration in order to form corresponding PN junctions with the channel region, which is covered by the gate electrode structure 130. Consequently, the semiconductor fins 110 may enable a controlled current flow along a length direction 110L, wherein the current flow may be controlled by the gate electrode structure 130. For this purpose, a height 110H and a width 110W of the fins 110 may be appropriately selected in combination with the characteristics of the gate electrode structure 130 so as to obtain a reliable control of the current flow. As previously discussed, for given lateral dimensions of the transistor 120, a significantly increased overall drive current may be obtained, while patterning of the gate electrode structure 130 may be less critical, for instance, with respect to a thickness of a gate dielectric material.

Typically, the semiconductor device 100 comprising the three-dimensional transistor 120 may be formed on the basis of appropriate patterning techniques in which the semiconductor fins 110 may be formed on the basis of sophisticated lithography and etch techniques in order to etch through the initial semiconductor layer 103 (FIG. 1a), while using the buried insulating layer 102 as an etch stop material. Thereafter, the gate electrode structure 130 is formed, for instance, by adding a desired gate dielectric material, such as a silicon oxide-based material, which may be accomplished by oxidation and/or deposition, followed by the deposition of an electrode material, such as polysilicon and the like. It should be appreciated that a cap layer 112, if required, may be formed prior to patterning the semiconductor fins and may be patterned together with the semiconductor layer. After providing the gate layer stack, appropriate lithography and etch techniques may be applied in order to form the gate electrode structure 130 having a desired "gate length," indicated as 130L. Thus, a desired short gate length may be obtained wherein, nevertheless, superior controllability is achieved since the gate control voltage may be applied from both sidewalls 110A, 110B, contrary to the planar transistor 150 as illustrated in FIG. 1a. The drain and source regions 122, 123 may be formed on the basis of ion implantation processes and the like in accordance with any appropriate process strategy.

In order to further enhance performance of the transistor 120, it has been proposed to also apply strain-inducing mechanisms similarly as described with reference to the planar transistor 150 of FIG. 1a, for instance by providing highly stressed dielectric materials, by incorporating a strain-inducing semiconductor material in the semiconductor fins 110 and the like. However, due to the complex configuration of the transistor 120 and due to the overall reduced dimensions, the corresponding strain-inducing mechanisms may also be less effective, while at the same time extremely complex additional processes may have to be implemented into the overall process flow. For instance, the deposition of a highly stressed dielectric material between and above the semiconductor fins 110 may impose significant restrictions with respect to gap filling capabilities of the corresponding process techniques, thereby resulting in relatively low internal stress levels, which may thus substantially not contribute to a significant enhancement of transistor performance.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques and semiconductor devices in which three-dimensional transistor architectures, such as FINFETs or generally transistors having a non-planar channel region, may be provided such that a significant substantially uniaxial strain component may be obtained along the current flow direction while not unduly contributing additional process complexity. To this end, a globally strained semiconductor layer or a layer portion may be provided as a semiconductor base material from which corresponding semiconductor bodies, such as semiconductor fins, may be obtained. Due to the specific geometry of the semiconductor body, i.e., a pronounced length along the current flow direction and a significantly lesser width perpendicular to the current flow direction, in combination with a given thickness of the semiconductor base layer, a significant fraction of the initial global biaxial strain component may be preserved in the current flow direction, thereby achieving a significant modification of the charge carrier mobility. Furthermore, due to the biaxial strain conditions of the initial strained semiconductor layer or layer portion, a high degree of flexibility in selecting an appropriate orientation of the length direction of the semiconductor bodies or semiconductor fins may be achieved, since the specific geometry of these components may result in a desired strain component along the length direction, irrespective of the absolute orientation of the elongated semiconductor fin. Consequently, the efficient strain engineering accomplished by providing a globally strained semiconductor layer or layer portion may be efficiently combined with other crystallographic characteristics or layout requirements, since different semiconductor fins may be oriented differently, for instance aligned to specific crystallographic directions and/or in view of layout requirements, while nevertheless preserving the desired high uniaxial strain component. Moreover, by adjusting the type of the initial biaxial strain of the semiconductor layer or layer portion, any type and magnitude of the substantially uniaxial strain component in the semiconductor bodies may be adjusted without significant complexity compared to conventional strategies, as previously explained. Thus, high tensile or compressive strain components may be induced in the various semiconductor fins, wherein different layer portions on a single substrate may be provided with different types or magnitude of strain, thereby enabling an efficient "patterning" of the strain condition within a desired area of the initial semiconductor layer or layer portion.

One illustrative method disclosed herein comprises providing a semiconductor layer formed above a substrate, wherein the semiconductor layer comprises a biaxial strain. The method further comprises forming a semiconductor fin from the semiconductor layer, wherein the semiconductor fin has a length and a width such that a substantially uniaxial strain is obtained that is oriented along a length of the semiconductor fin. Additionally, the method comprises forming a gate electrode structure on a central portion of the semiconductor fin, wherein the gate electrode structure is configured to control a channel region in the semiconductor fin. Finally, drain and source areas are formed in the semiconductor fin adjacent to the channel region.

A further illustrative method disclosed herein relates to forming a transistor of a semiconductor device. The method comprises forming an elongated semiconductor body above a substrate, wherein the elongated semiconductor body comprises a strain component along a length direction of the elongated semiconductor body. Additionally, a drain region is formed in a first portion of the elongated semiconductor body and a source region is formed in a second portion of the elongated semiconductor body. Additionally, the method comprises forming a gate electrode structure adjacent to a third portion of the elongated semiconductor body, wherein the gate electrode structure is configured to control a current flow in the third portion along the length direction.

One illustrative semiconductor device disclosed herein comprises a semiconductor fin comprising a drain region and a source region and a channel region positioned between the drain region and the source region. At least the channel region has a uniaxial strain along a length direction of the semiconductor fin that is equal to or higher than a strain in the drain and source regions. Additionally, the semiconductor device comprises a gate electrode structure formed adjacent to the channel region and configured to control a current flow through the channel region.

BRIEF DESCRIPTION OF THE DRAWINGS

The disclosure may be understood by reference to the following description taken in conjunction with the accompanying drawings, in which like reference numerals identify like elements, and in which:

FIG. 2b schematically illustrates an enlarged view of a layer portion of the substrate of FIG. 2a;

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure provides non-planar transistor architectures in which a high strain component along the current flow direction may be achieved on the basis of a globally strained semiconductor material, from which elongated semiconductor bodies, such as semiconductor fins, may be formed. To this end, it has been recognized that the specific geometry of the elongated semiconductor bodies or semiconductor fins may enable an efficient preservation of the initial strain component of the biaxially strained semiconductor material along the length direction and thus along the current flow direction, while the strain relaxation in the width direction of the elongated semiconductor bodies does not negatively affect the electronic characteristics. Furthermore, due to the biaxial nature of the initial strain component of the base semiconductor material, the elongated semiconductor bodies or fins may be oriented with the length direction in any desired direction, while still obtaining the high desired uniaxial strain component. Consequently, semiconductor fins with different length orientation may be provided without affecting the desired high strain component therein. For example, semiconductor fins that may form any desired angle with respect to their length direction, such as a 90 degree angle and the like, may be formed without impacting the overall strain conditions in the differently oriented semiconductor fins. Furthermore, since the various strain components, such as tensile strain and compressive strain, may have a different effect for the charge carrier mobility along different crystallographic axes, the orientation of the semiconductor fins may also be adjusted on the basis of the basic crystallographic configuration of the globally strained semiconductor material.

In this respect, a crystallographic direction is to be understood as a direction representing a group of crystallographic axes that are physically equivalent and are parallel to each other. For example, in a cubic crystal, such as a silicon crystal, the (100), the (010), the (001), the (−100), . . . direction or axes may be considered as physically equivalent and may be represented by a 100 direction. Similar considerations may apply for other crystallographic directions, such as a (110) direction and the like. Consequently, the charge carrier mobility along a (110) direction, which is the standard current flow direction of silicon-based transistors, may be modified for electrons and holes, respectively, by applying a tensile and a compressive strain component along this crystallographic direction. On the other hand, these strain components may have a different effect for electrons and holes, respectively, when selecting, for instance, a (100) direction as a current flow direction. Since the semiconductor fins may be oriented along any desired direction, while still preserving a significant portion of the initial strain, an efficient strain engineering may be accomplished by also considering the crystallographic configuration of the biaxially strained semiconductor material.

Furthermore, a global strain of a semiconductor material is to be understood to refer to the biaxial strain condition of a layer or layer portion having lateral dimensions that may not substantially result in a significant reduction of the biaxial strain, even if at a perimeter of the layer portion, the strain may be relaxed, for instance, by providing an isolation structure and the like. That is, a semiconductor layer or layer portion having lateral dimensions of several micrometers in any direction may be considered as a globally strained semiconductor layer, since these dimensions are still significantly greater than lateral dimensions of a transistor element and may still provide a significant strain component, at least in a central portion of the semiconductor layer under consideration. For instance, a semiconductor base material may be provided with different areas having dimensions of several micrometers or several tenths or hundreds of micrometers, wherein each of these different areas may have a specified biaxial strain, except for any edge regions, so that at least the central portions of these areas may be considered as globally strained semiconductor materials that may enable provision of a plurality of elongated semiconductor bodies in which a significant fraction of the initial strain component may be preserved along the length direction of the semiconductor bodies or fins.

In other cases, a globally strained semiconductor layer may be understood as a semiconductor layer that may extend across the entire carrier substrate. For example, strained SOI (SSOI) substrates may be available which comprise a silicon-based semiconductor layer with a specified thickness and crystallographic configuration, wherein a biaxial strain, such as tensile or compressive strain, may be approximately 1.0 GPa and significantly higher. Consequently, any such SSOI devices may be efficiently used for forming non-planar transistor elements with a high internal strain component.

With reference to FIGS. 2a-2j, further illustrative embodiments will now be described in more detail, wherein reference may also be made to FIGS. 1a-1b, if appropriate.

Figure 2A:
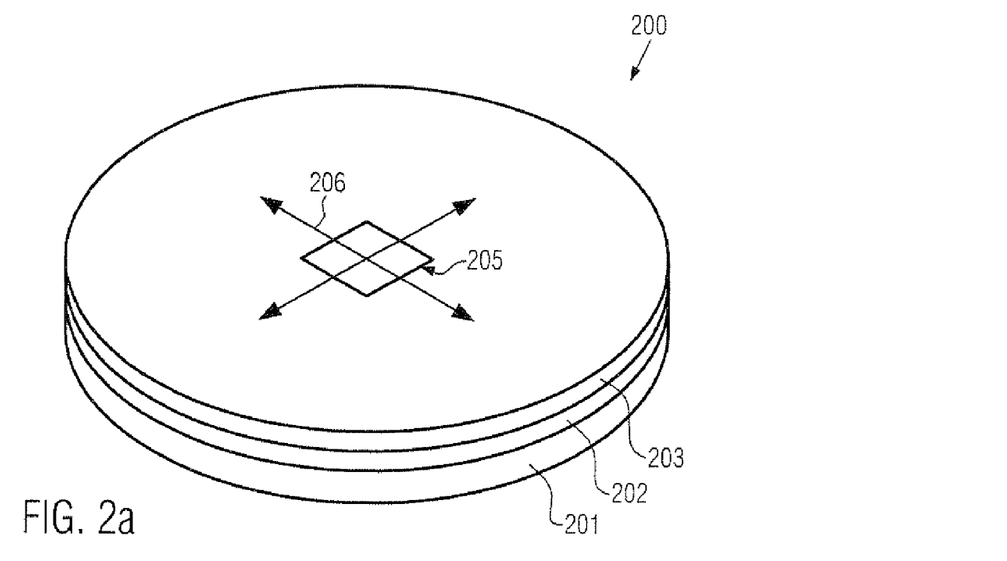
FIG. 2a schematically illustrates a perspective view of a substrate comprising a globally strained semiconductor layer, for instance in the form of an SOI device, which may be used as a base material for forming highly strained three-dimensional transistors, according to illustrative embodiments.

FIG. 2a schematically illustrates a perspective view of a "semiconductor device" 200 which may represent the raw material for forming complex integrated circuits on the basis of non-planar transistors, such as FINFETs and the like, possibly in combination with planar transistor elements, as previously described with reference to FIG. 1a. The device 200 may comprise a substrate 201, such as a silicon material, on which may be formed a buried insulating layer 202, such as a silicon dioxide material and the like. Moreover, a silicon-based semiconductor layer 203 may be formed on the buried insulating layer 202 and may comprise a desired high biaxial strain component 206. It should be appreciated that FIG. 2a is not true to scale since, for instance, the thickness of the semiconductor layer 203 with respect to the thickness of the substrate material 201 is illustrated in a significant disproportional manner. For example, a thickness of the semiconductor layer 203 may be in the range of several hundred nanometers to several tenths nanometer and even less, for instance approximately 10-30 nm, depending on the device requirements. It should be appreciated that the biaxial strain 206 is to be understood as a strain that prevails in any direction within the semiconductor layer 203 so that, in a specific area or layer portion 205, substantially the same strain conditions may be encountered, irrespective of the position of the area 205 above the substrate 201, except for the perimeter of the substrate 201. In the example of FIG. 2a, the biaxial strain 206 is illustrated as a tensile strain component, while in other cases a compressive strain may be provided, as will be described later on in more detail. Furthermore, in other illustrative embodiments, as will be described in more detail, different types and/or magnitudes of the biaxial strain 206 may be provided in different areas 205, wherein each area 205 may, however, have lateral dimensions so as to be considered as a globally strained semiconductor material, as discussed above.

Figure 2B:
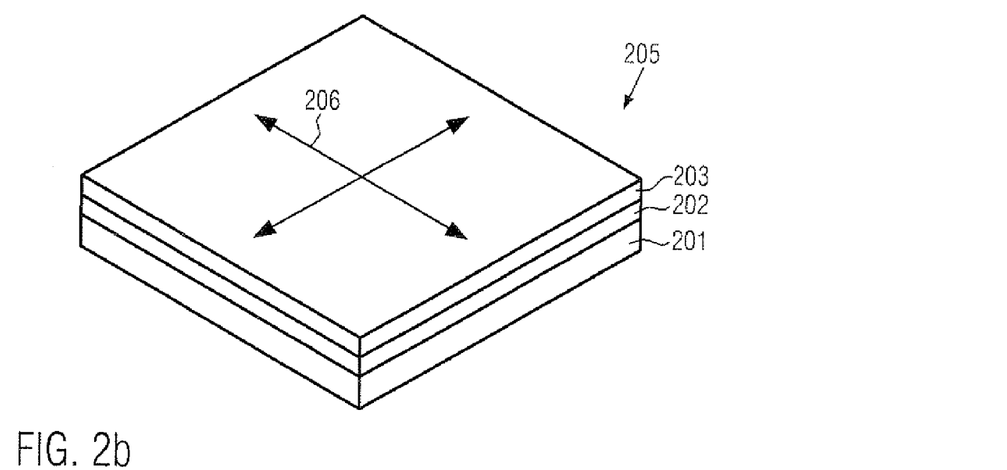

FIG. 2b schematically illustrates the device area 205 having the biaxial strain 206, wherein the area 205 may be appropriate for forming therein a plurality of non-planar transistor elements, for instance in the form of a plurality of semiconductor fins, while preserving a significant fraction of the strain component 206 along a length direction of any of these elongated semiconductor bodies of fins, irrespective of the orientation of the length direction within the semiconductor area 205.

Figure 2C:
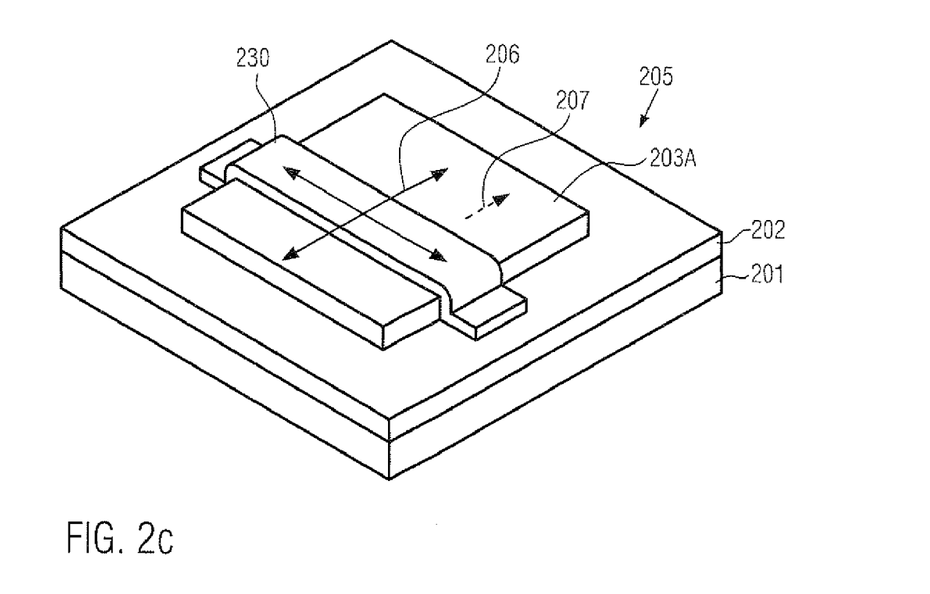
FIG. 2c schematically illustrates an active region for a conventional transistor formed on the basis of a globally strained semiconductor material, wherein the disadvantageous geometry of the active region may result in a significant strain relaxation.

FIG. 2c schematically illustrates a perspective view of the semiconductor layer or area 205 when the semiconductor material thereof may be patterned so as to provide an active region 203A for a substantially conventional and planar transistor configuration in which a gate electrode structure 230 may extend across the active region 203A, thereby defining a current flow direction 207. In this case, drain and source areas (not shown) would have to be provided at each side of the gate electrode structure 230, wherein, in view of achieving reduced dimensions of a transistor element while maintaining a desired drive current capability, as previously explained with reference to FIG. 1a, a significant width of the active region 203A, which is to be understood as the direction perpendicular to the current flow direction 207, may have to be preserved. Furthermore, for reducing the overall size of the active region 203A, the extension of the active region 203A along the current flow direction 207 would be reduced, thereby resulting in a geometric configuration which may lead to a significant reduction of the initial strain 206, in particular along the current flow direction 207.

Figure 2D:
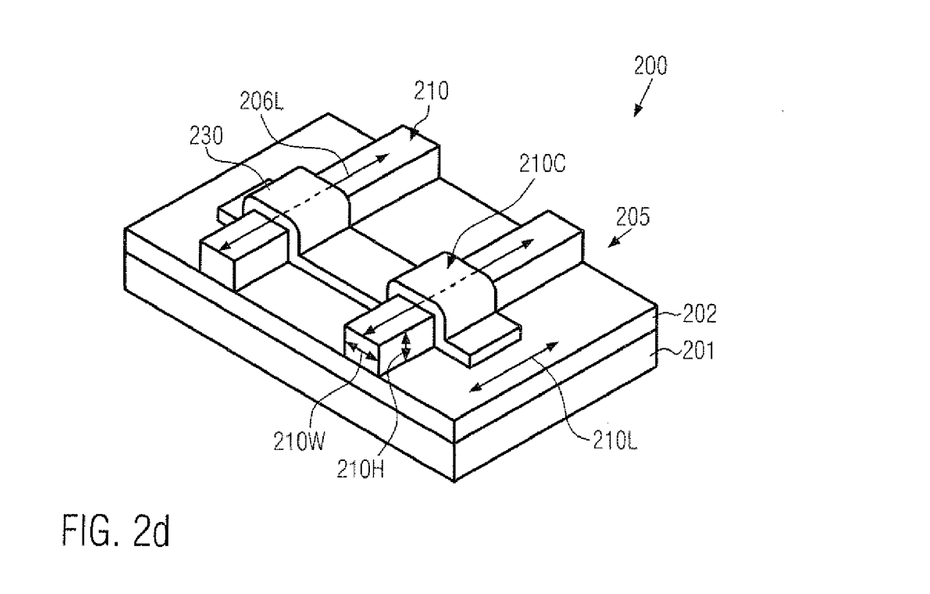
FIG. 2d schematically illustrates a perspective view of semiconductor fins of a non-planar transistor element formed on the basis of a globally strained semiconductor material, thereby preserving a significant uniaxial strain component along the current flow direction within the semiconductor fins, according to illustrative embodiments.

FIG. 2d schematically illustrates the semiconductor device 200 in which a plurality of semiconductor bodies 210 may be provided in the area 205. In this case, the semiconductor bodies 210, which may represent elongated elements of "residues" of the globally strained semiconductor layer 203 (FIGS. 2a and 2b), may be considered as "active regions" in which the lateral dimension along a length direction 210L is significantly greater than a lateral dimension perpendicular to the current flow direction, as indicated by 210W. Thus, for a given height 210H of the semiconductor bodies 210, the lateral extension along the length direction 210L may result in an aspect ratio which may preserve a significant uniaxial strain component 206L along the length direction 210L. On the other hand, due to the reduced width 210W, a corresponding strain component perpendicular to the current flow direction, i.e., the length direction 210L, may be substantially completely relaxed upon forming the semiconductor bodies 210. Consequently, due to the geometry of the semiconductor bodies 210, an efficient "conversion" of the biaxial strain 206 (FIG. 2b) into the substantially uniaxial strain 206L may be achieved, thereby preserving a significant fraction of the initial high strain component in each of the semiconductor bodies 210. For example, strain values of approximately 1 GPa and significantly higher may be accomplished by providing a strained SOI device so that, after patterning the semiconductor bodies 210, the uniaxial component 206L of comparable magnitude may be preserved. That is, for the above-specified initial biaxial strain component, the uniaxial component 206L on the order of magnitude of 0.8 GPa and higher may be obtained, depending on the specifically selected geometrical configuration of the semiconductor bodies 210. For example, selecting a height 210H in a range of approximately 5-30 nm and by using a length of the bodies 210 along the length direction 210L of approximately 80-300 nm, a uniaxial strain component of 0.5-1.0 GPa may be obtained for an initial biaxial strain component of 1.0 GPa. It should be appreciated that these strain values may be obtained at a central portion 210C of the semiconductor bodies 210 since the strain may be less at end portions of the bodies 210, which, however, may not negatively influence the electronic characteristics of a channel region, which may typically be provided in the central portion 210C.

The semiconductor device 200 as illustrated in FIG. 2d may be formed in accordance with any appropriate manufacturing technique, as is also, for instance, described with reference to the device 100 of FIG. 1b. That is, first, the device area 205 comprising the globally biaxially strained semiconductor layer 203 (FIGS. 2a and 2b) may be provided so as to have any desired strain value and crystallographic configuration. For example, as previously explained, strained SOI substrates may be formed or may be available having the desired characteristics. In other cases, additional semiconductor material may be epitaxially grown on a base material in order to obtain a desired thickness and crystalline quality of the base material. For example, based on the device 200 as illustrated in FIG. 2a, a thin semiconductor material may be epitaxially grown so as to obtain a desired thickness. In other cases, the thickness of the layer 203 of FIG. 2a may be reduced, for instance, by polishing, etching and the like, possibly in combination with a further epitaxial growth so as to obtain superior crystal quality of the layer 203. After providing the semiconductor base material having the desired high internal strain level, the semiconductor bodies 210 within a specified area, such as the device area 205, may be formed on the basis of sophisticated lithography and etch techniques, wherein the buried insulating material 202 may act as an etch stop material. Thereafter, the gate electrode structure 230 may be provided, for instance, by depositing and/or by performing a surface treatment for providing an appropriate gate dielectric material, followed by the deposition of an electrode material, such as polysilicon, silicon/germanium and the like. The resulting layer stack may then be patterned in order to obtain the gate electrode structure 230 having a desired length along the length direction 210L. The further processing may be continued by incorporating a desired dopant species in exposed portions of the semiconductor bodies 210 in order to provide drain and source regions.

Figure 2E:
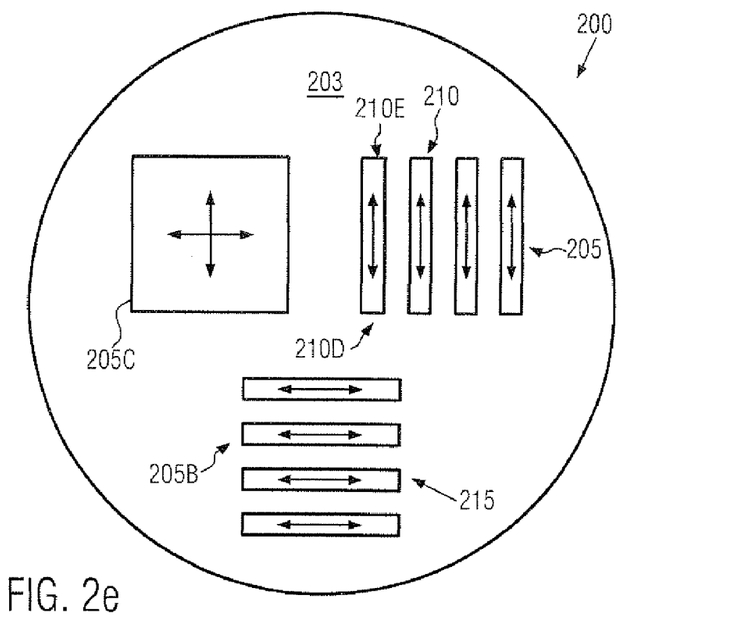
FIG. 2e schematically illustrates a top view of a substrate comprising a biaxially strained semiconductor layer and differently oriented semiconductor fins formed from the biaxially strained semiconductor layer, according to illustrative embodiments.

FIG. 2e schematically illustrates a top view of the semiconductor device 200 according to illustrative embodiments in which differently oriented semiconductor bodies or fins 210 and 215 may be provided on the basis of a globally strained semiconductor material. It should be emphasized that the lateral dimensions illustrated in FIG. 2e are not true to scale and are only selected in view of clearly demonstrating the principles disclosed herein. In the embodiment shown, the semiconductor fins or bodies 210 may be formed in a device area 205 on the basis of the globally strained semiconductor layer 203, as previously discussed. Furthermore, the semiconductor fins 215 may be formed in the same device area 205 or in a different area 205B, in accordance with the overall design and layout requirements. For example, the fins 215 may be substantially orthogonal with respect to the fins 210. As discussed above, due to the biaxial strain conditions of the base layer 203, substantially the same uniaxial strain components may be obtained in the semiconductor fins 210 and 215 when the same geometry of the fins is applied. In other cases, the lateral dimensions, such as the length of the fins, may be selected differently, thereby enabling a modulation of the resulting uniaxial strain component, as, for instance, a reduction in the length may result in a reduction of the remaining uniaxial strain component, since the strain relaxation may be significant at end portions 210E, 210D and may increase significantly towards the central portion of the fins 210 or 215. Consequently, by reducing the length, the influence of the end portions 210E, 210D on the central portion may increase, thereby providing an efficient mechanism for adjusting the actual strain component in the central portion and thus in a channel region of a corresponding transistor device.

As illustrated, the device 200 may comprise other areas, such as a device area 205C, in which a global strain component may still be present and which may be used for forming three-dimensional transistors, or any other transistors or circuit elements, depending on the overall device requirements.

Figure 2F:
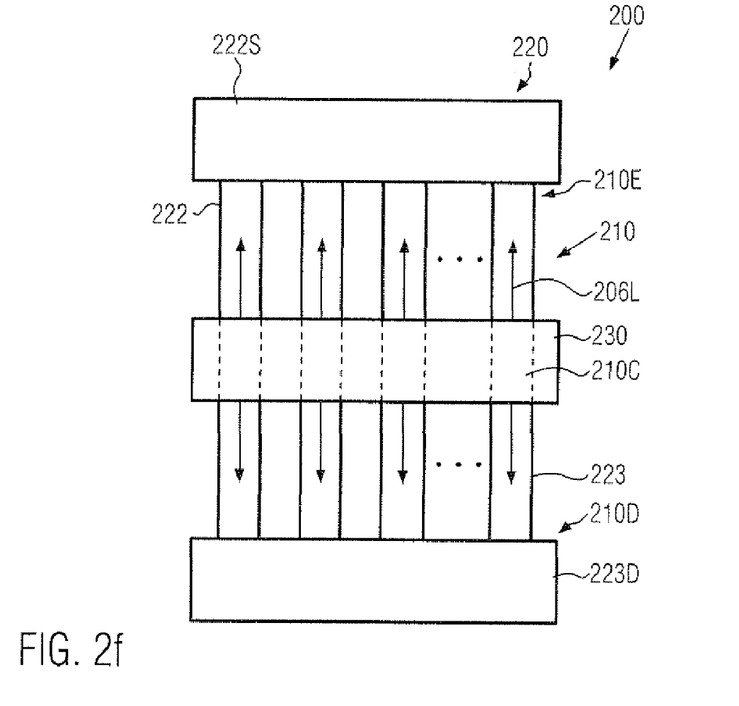
FIG. 2f schematically illustrates a top view of a transistor comprising a plurality of semiconductor fins having a high uniaxial tensile strain component, according to illustrative embodiments.

FIG. 2f schematically illustrates a top view of the semiconductor device 200 wherein a non-planar transistor 220 may comprise a plurality of the fins 210 in combination with the gate electrode structure 230. The fins 210 may comprise the uniaxial strain component 206L, which is illustrated as a tensile strain component in this embodiment, wherein the strain component 206L may be maximal in a central portion or channel portion 210C that is covered by the gate electrode structure 230. As previously discussed, a significant fraction of the initial biaxial strain component may be preserved in the fins 210, wherein the corresponding strain component may be maximal in the central area 210C due to the influence of the corresponding end portions 210E, 210D. Furthermore, a certain degree of strain relaxation may be caused by implantation processes, which may be applied to form source regions 222 and drain regions 223 in the semiconductor fins 210. Furthermore, in the embodiment shown, a plurality of fins 210 may be connected at each side of the gate electrode structure 230, for instance by means of an epitaxially grown semiconductor material, a conductive material and the like, thereby providing a common source 222S and a common drain 223D of the transistor 220. Thus, a desired high drive current capability of the transistor 220 may be accomplished by selecting an appropriate number of semiconductor fins 210, each of which may provide superior channel control and drive current capability due to the three-dimensional configuration in combination with the moderately high uniaxial strain component 206L, in particular in the channel region 210C.

The transistor 220 may be formed in accordance with any appropriate manufacturing technique. That is, after patterning the semiconductor fins 210 and providing the gate electrode structure 230, appropriate implantation processes may be performed or any other process techniques may be applied so as to locally introduce a desired dopant species into the drain regions 222 and source regions 223. Depending on the process strategy, the common source and drain areas 222S, 223D may be formed commonly with the semiconductor fins 210 or may be provided separately in a subsequent manufacturing sequence. Thereafter, the further processing may be continued by providing an interlayer dielectric material in combination with appropriate contact elements in accordance with well-established process techniques.

Figure 2G:
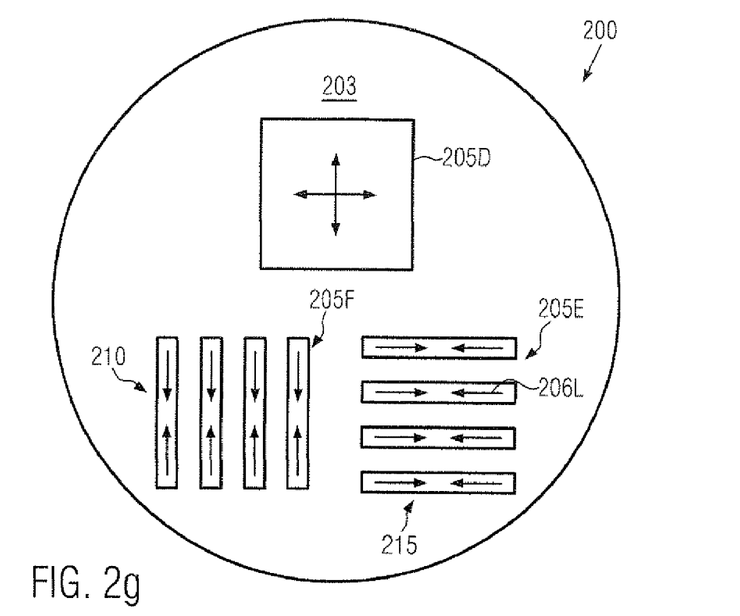
FIGS. 2g and 2h schematically illustrate a globally strained semiconductor layer and a single transistor, respectively, wherein a high compressive strain component may be achieved, according to still further illustrative embodiments.

FIG. 2g schematically illustrates the semiconductor device 200 according to further illustrative embodiments in which the semiconductor fins 210, 215 may be provided in corresponding device areas 205F, 205E, respectively, so as to have a compressive strain component. For example, a device area 205D may still have a globally strained semiconductor material of the initial semiconductor layer 203, which may have a high biaxial compressive strain component. As discussed above, the semiconductor fins 210, 215 may have any desired orientation, depending on the layout and device requirements.

Figure 2H:
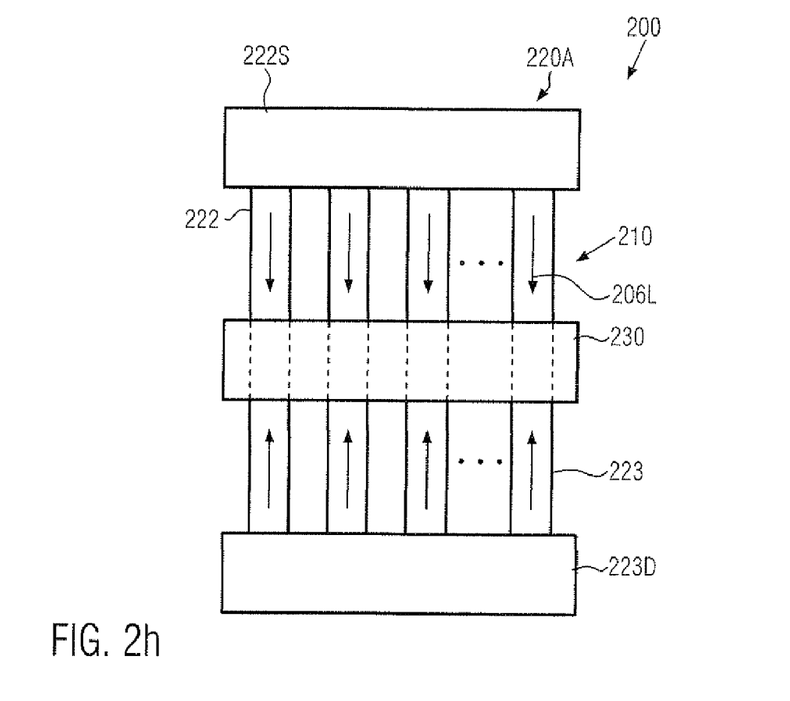

FIG. 2h schematically illustrates the semiconductor device 200 in which a single transistor element 220A may be provided with the fins 210 having the strain component 206L as a compressive strain. Furthermore, the transistor 220A may comprise the common drain and source areas 222S, 223D, respectively, in combination with the drain and source regions 223, 222 of the individual semiconductor fins 210. It should be appreciated that the transistor 220A may represent a P-channel transistor or an N-channel transistor, depending on whether the strain component 206L may provide superior hole mobility or electron mobility. As previously discussed, for a standard crystallographic configuration, i.e., for a silicon material having a (100) surface orientation and with the current flow direction oriented along a (110) crystallographic direction, a compressive strain may enhance hole mobility so that the transistor 220A may represent a P-channel transistor. For the same crystallographic configuration, the transistor 220 of FIG. 2f may represent an N-channel transistor. Consequently, the doping of the drain and source regions 223, 222 may be appropriately adapted to the conductivity type of the transistor under consideration.

Figure 2I:
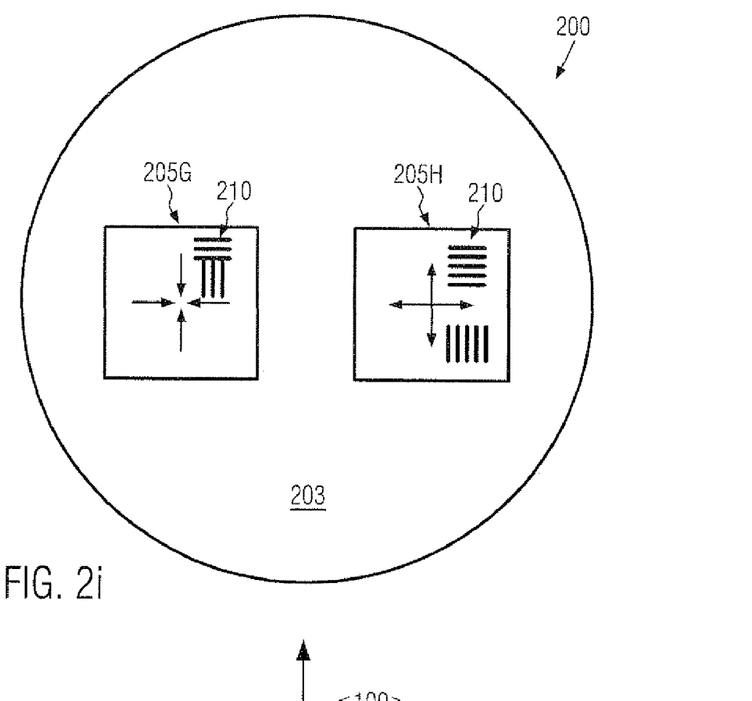
FIGS. 2i and 2j schematically illustrate semiconductor layers comprising a plurality of semiconductor fins with different orientation and/or different type of strain and/or oriented along different crystallographic directions, according to still further illustrative embodiments.

FIG. 2i schematically illustrates the semiconductor device 200 according to still further illustrative embodiments in which device areas 205G, 205H of different global biaxial strain may be provided in order to enable the fabrication of corresponding semiconductor bodies or fins therein. For example, the device area 205G corresponds to an area in which the base layer 203 may have a compressive biaxial strain prior to patterning the semiconductor fins 210, while the area 205H may have initially a tensile strain prior to patterning the fins 210. It should further be appreciated that within each area 205G, 205H, the respective fins 210 may have any appropriate orientation without affecting the strain conditions in the differently oriented fins 210 within each of the regions 205G, 205H.

The regions 205G, 205H of different initial global strain may be formed on the basis of any appropriate process technique, for instance by wafer bond techniques, in which a strain-inducing buffer layer may be provided so as to have locally different characteristics to induce a different type of strain upon forming the actual silicon-based material on the buffer layer. For example, a relaxed silicon/germanium layer may act as a buffer material for forming thereon a silicon material, which may thus be formed in a strained state due to the lattice mismatch between the silicon/germanium material and the natural lattice constant of silicon. By providing different germanium concentrations at areas corresponding to the device areas 205G, 205H, different strain conditions may be achieved in the corresponding silicon layer, which may then be transferred to a carrier substrate based on well-established wafer bond techniques. It should be appreciated that any other process technique may be applied in which the regions 205G, 205H may be provided with a desired strain level and orientation.

Figure 2J:
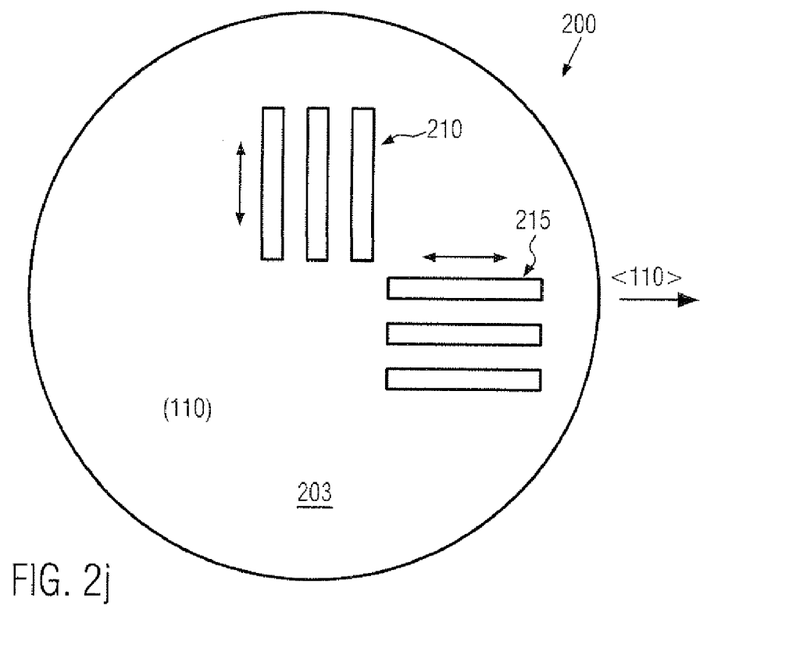

FIG. 2j schematically illustrates the semiconductor device 200 in which the semiconductor fins 210, 215 may be oriented differently and may be concurrently aligned to a desired crystallographic direction. Furthermore, the fins 210, 215 may have any desired type and magnitude of uniaxial strain. As previously discussed, the degree of modification of charge carrier mobility may also significantly depend on the crystallographic direction along which the current flow may occur during operation of the transistor elements. For example, a compressive strain component along a crystallographic (100) direction may act differently compared to a compressive strain acting along the crystallographic direction (110) as the current flow direction. Since the uniaxial strain component in the semiconductor fins 210, 215 may be obtained substantially independently from their absolute orientation, a desired adaptation with respect to the crystallographic directions may be accomplished by aligning the length direction of the fins to the desired crystallographic direction. In the example shown, the initial base layer 203 may have a (110) surface orientation, thereby providing the two crystallographic directions (110) and (100) with an angle of 90 degrees. In this manner, the different crystallographic directions may also be readily implemented into the overall design layout of the device 200. It should be appreciated, however, that the semiconductor fins 210, 215 may be oriented or aligned to any desired crystallographic direction that may be available on the basis of the crystallographic configuration of the base material 203. Consequently, a high degree of flexibility with respect to enhancing charge carrier mobility and respecting layout and design criteria may be achieved on the basis of the principles disclosed herein.

As a result, the present disclosure provides semiconductor devices and manufacturing techniques in which non-planar transistors may be provided so as to have a high uniaxial strain level in a channel region thereof without adding additional process complexity. For this purpose, a globally strained semiconductor material layer or layer portion may be used for forming elongated semiconductor bodies, thereby preserving a significant fraction of the initial biaxial strain due to the geometric configuration of the elongated semiconductor bodies. Consequently, compressive and tensile biaxial strain may be transferred into a uniaxial strain in semiconductor fins irrespective of the orientation of the semiconductor fins. Furthermore, the strain mechanism disclosed herein may enable further device scaling without additional process complexity, while also providing the possibility of additionally implementing conventional strain-inducing mechanisms.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   providing a semiconductor layer formed above a substrate, said semiconductor layer comprising a biaxial strain;
   forming a semiconductor fin from said semiconductor layer, said semiconductor fin having a length and a width, said length and said width resulting in a substantially uniaxial strain oriented along a length of said semiconductor fin;
   forming a gate electrode structure on a central portion of said semiconductor fin, said gate electrode structure being configured to control a channel region in said semiconductor fin; and
   forming drain and source areas in said semiconductor fin adjacent to said channel region.

2. The method of claim 1, wherein providing said semiconductor layer comprises providing a strained semiconductor layer formed on an insulating material.

3. The method of claim 1, wherein a strain level is substantially uniform across said substrate.

4. The method of claim 1, wherein providing said semiconductor layer comprises providing a first layer portion having a first type of biaxial strain and providing a second layer portion having a second type of biaxial strain that differs from said first type of biaxial strain.

5. The method of claim 1, further comprising forming a second semiconductor fin from said semiconductor layer, wherein a length of said second semiconductor fin is substantially orthogonal to the length of said semiconductor fin.

6. The method of claim 5, wherein providing said semiconductor layer comprises providing said semiconductor layer with a first crystallographic direction representing a first group of physically equivalent crystal axes oriented along the length of said semiconductor fin and with a second crystallographic direction representing a second group of physically equivalent axes oriented along the length of said second semiconductor fin.

7. The method of claim 6, wherein said first group is physically different from said second group.

8. The method of claim 7, wherein said first group is represented by a <100> axis and said second group is represented by a <110> axis.

9. A method of forming a transistor of a semiconductor device, the method comprising:
   forming an elongated semiconductor body above a substrate, said elongated semiconductor body comprising a strain component along a length direction of said elongated semiconductor body;
   forming a drain region in a first portion of said elongated semiconductor body;
   forming a source region in a second portion of said elongated semiconductor body; and
   forming a gate electrode structure adjacent to a third portion of said elongated semiconductor body, said gate electrode structure being configured to control a current flow in said third portion along said length direction.

10. The method of claim 9, wherein forming said elongated semiconductor body comprises providing a semiconductor layer above said substrate so as to have a biaxial strain and forming said elongated semiconductor body from a portion of said biaxially strained semiconductor layer.

11. The method of claim 10, wherein providing said semiconductor layer comprises providing a buried insulating layer below said semiconductor layer and using said buried insulating layer as an etch stop material when forming said elongated semiconductor body.

12. The method of claim 10, wherein said semiconductor layer is provided so as to have a strain of at least approximately 1 GPa.

13. The method of claim 12, wherein forming said elongated semiconductor body comprises selecting a length of said elongated semiconductor body and a thickness of said semiconductor layer so as to preserve at least approximately 70 percent of said strain along said length direction.

14. The method of claim 9, further comprising forming a second elongated semiconductor body that is substantially parallel to said elongated semiconductor body and connecting a drain region of said second elongated semiconductor body with the drain region of said elongated semiconductor body.

15. The method of claim 9, further comprising forming a second elongated semiconductor body whose length direction is orthogonal to the length direction of said elongated semiconductor body.

16. The method of claim 9, wherein said elongated semiconductor body is formed so as to have a width of approximately 50 nm or less.

* * * * *